(12) United States Patent
Germagian et al.

(10) Patent No.: US 7,604,535 B2
(45) Date of Patent: Oct. 20, 2009

(54) ASSEMBLY FOR EXTRACTING HEAT FROM A HOUSING FOR ELECTRONIC EQUIPMENT

(75) Inventors: Mark Germagian, Hubbardston, MA (US); John Prunier, Spencer, MA (US); Martin Olsen, East Greenwich, RI (US)

(73) Assignee: Wright Line, LLC, Worcester, MA (US)

( * ) Notice: Subject to any disclaimer, the term of this patent is extended or adjusted under 35 U.S.C. 154(b) by 366 days.

(21) Appl. No.: 11/412,430

(22) Filed: Apr. 27, 2006

(65) Prior Publication Data

US 2007/0254583 A1  Nov. 1, 2007

(51) Int. Cl.
*H05K 5/00* (2006.01)
*F25D 23/12* (2006.01)
*H05K 7/20* (2006.01)

(52) U.S. Cl. .................. 454/184; 62/259.2; 361/694; 361/690

(58) Field of Classification Search ............... 454/184
See application file for complete search history.

(56) References Cited

U.S. PATENT DOCUMENTS

| | | |
|---|---|---|
| 3,903,404 A | 9/1975 | Beall et al. |
| 4,158,875 A | 6/1979 | Tajima et al. |
| 4,774,631 A | 9/1988 | Okuyama et al. |
| 5,173,819 A | 12/1992 | Takahashi et al. |
| 5,544,012 A | 8/1996 | Koike |
| 5,671,805 A | 9/1997 | Stahl et al. |
| 5,718,628 A | 2/1998 | Nakazato et al. |
| 5,934,368 A | 8/1999 | Tanaka et al. |
| 6,052,282 A | 4/2000 | Sugiyama et al. |
| 6,186,890 B1 | 2/2001 | French et al. |
| 6,400,567 B1 | 6/2002 | McKeen et al. |
| 6,412,292 B2 | 7/2002 | Spinazzola et al. |
| 6,494,050 B2 | 12/2002 | Spinazzola et al. |
| 6,557,357 B2 | 5/2003 | Spinazzola et al. |
| 6,574,970 B2 | 6/2003 | Spinazzola et al. |
| 6,722,151 B2 | 4/2004 | Spinazzola et al. |
| 6,745,579 B2 | 6/2004 | Spinazzola et al. |
| 7,033,267 B2 | 4/2006 | Rasmussen |
| 7,112,131 B2 | 9/2006 | Rasmussen et al. |
| 7,154,748 B2 * | 12/2006 | Yamada ...................... 361/690 |
| 7,238,104 B1 * | 7/2007 | Greenslade et al. ......... 454/184 |
| 7,283,358 B2 * | 10/2007 | Campbell et al. ........... 361/694 |
| 2002/0108386 A1 * | 8/2002 | Spinazzola et al. ......... 62/259.2 |

* cited by examiner

*Primary Examiner*—Steve McAllister
*Assistant Examiner*—Helena Kosanovic
(74) *Attorney, Agent, or Firm*—Brian M. Dingman; Mirick, O'Connell, DeMallie & Lougee, LLP

(57) ABSTRACT

An assembly for extracting heat from a housing for electronic equipment, the housing having a front, a back, two sides and a top. The assembly is defined by a back for the housing that defines an open area proximate the top, and an air passageway in fluid communication with the open area in the back, to conduct heated air exiting the housing through the open area away from the housing.

21 Claims, 4 Drawing Sheets

ASSEMBLY FOR EXTRACTING HEAT FROM A HOUSING FOR ELECTRONIC EQUIPMENT

FIELD OF THE INVENTION

This invention relates to a housing for electronic equipment with improved heat-dissipation characteristics.

BACKGROUND OF THE INVENTION

Electronic equipment is often located within a housing, such as an equipment rack used to hold computer servers and the like in assemblies that are located within the rack. The electronic equipment generates substantial heat that must be dissipated. Cool air typically passes through the housings to help dissipate heat. In many cases, fans located in the front door and/or back door and/or within the rack and/or in the top of the rack are used to circulate the cold air and expel the warmed air.

One solution proposes a front or back rack panel that is several inches thick, and carries ducting and fans to route air through the rack. Cool air enters the bottom of the front, and exits the top of the back. However, such thickened panels increase the depth of the racks, which inherently limits the number of racks that can be fit into a data center.

SUMMARY OF THE INVENTION

It is therefore an object of this invention to provide a rack cooling system that maintains the depth of the rack to a minimum, thus maximizing data center rack capacity.

This invention features an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. The open area preferably extends across at least the majority of the width of the back, and may extend across substantially all of the width of the back. The open area may also encompass a portion of the top adjacent to the back. The open area could alternatively be located in the top proximate the back. The front of the housing may be perforated. The housing may comprise an electronic equipment rack.

The assembly may further comprise an air-moving device in fluid communication with the air passageway. The air-moving device may be located in the air passageway, or located at the intersection of the back of the housing and the air passageway.

The air passageway may be directly coupled to the back of the housing. The air passageway may extend out from the back of the housing. The air passageway may further extend up after extending out from the back of the housing. In one particular embodiment, the air passageway may extend out at an angle of no more than about ninety degrees from the back of the housing; in a more particular embodiment, the air passageway may extend out at an angle of about forty-five degrees.

The air passageway may comprise a duct. The duct may be flexible or not. The assembly may comprise at least two ducts which are essentially parallel to one another. The assembly may further comprise an air-moving device in each duct. The air passageway may be located a sufficient height off the floor so as to meet relevant height safety regulations. There may be essentially no openings in the housing top, so that the entire top area is available for routing of additional equipment.

The invention also features a data center arrangement comprising at least two electronic equipment racks, each rack having a front, a back, two sides and a top, the arrangement comprising two electronic equipment racks spaced apart by about thirty-six inches, the back of each rack being essentially solid except for an open area proximate the top, and at least one air passageway in fluid communication with the open area in the back of each rack, to conduct heated air exiting the rack through the open area away from the rack. The data center may further comprise an enclosed ceiling. The air passageways may be in fluid communication with the enclosed ceiling. The data center may further comprise an air-cooling apparatus in fluid communication with the enclosed ceiling. The data center may further comprise means for providing cooled air from the air-cooling apparatus to the front of the racks.

These and other aspects of the invention will become apparent from the following description. In the description, reference is made to the accompanying drawings, which form a part hereof, and in which there are shown preferred embodiments of the invention. Such embodiments do not necessarily represent the full scope of the invention, and reference is therefore made to the claims for understanding the true scope of the invention.

BRIEF DESCRIPTION OF THE DRAWINGS

Other objects, features and advantages will occur to those skilled in the art from the following description of the preferred embodiments and the accompanying drawings, in which.

DETAILED DESCRIPTION OF THE PREFERRED EMBODIMENTS OF THE INVENTION

This invention may be accomplished in an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. Typically, the front is perforated and the sides are solid, so that air flows into the housing through the front, through the electronic equipment located in the housing, and out of the housing through the open area, into the passageway.

Figure 1A:
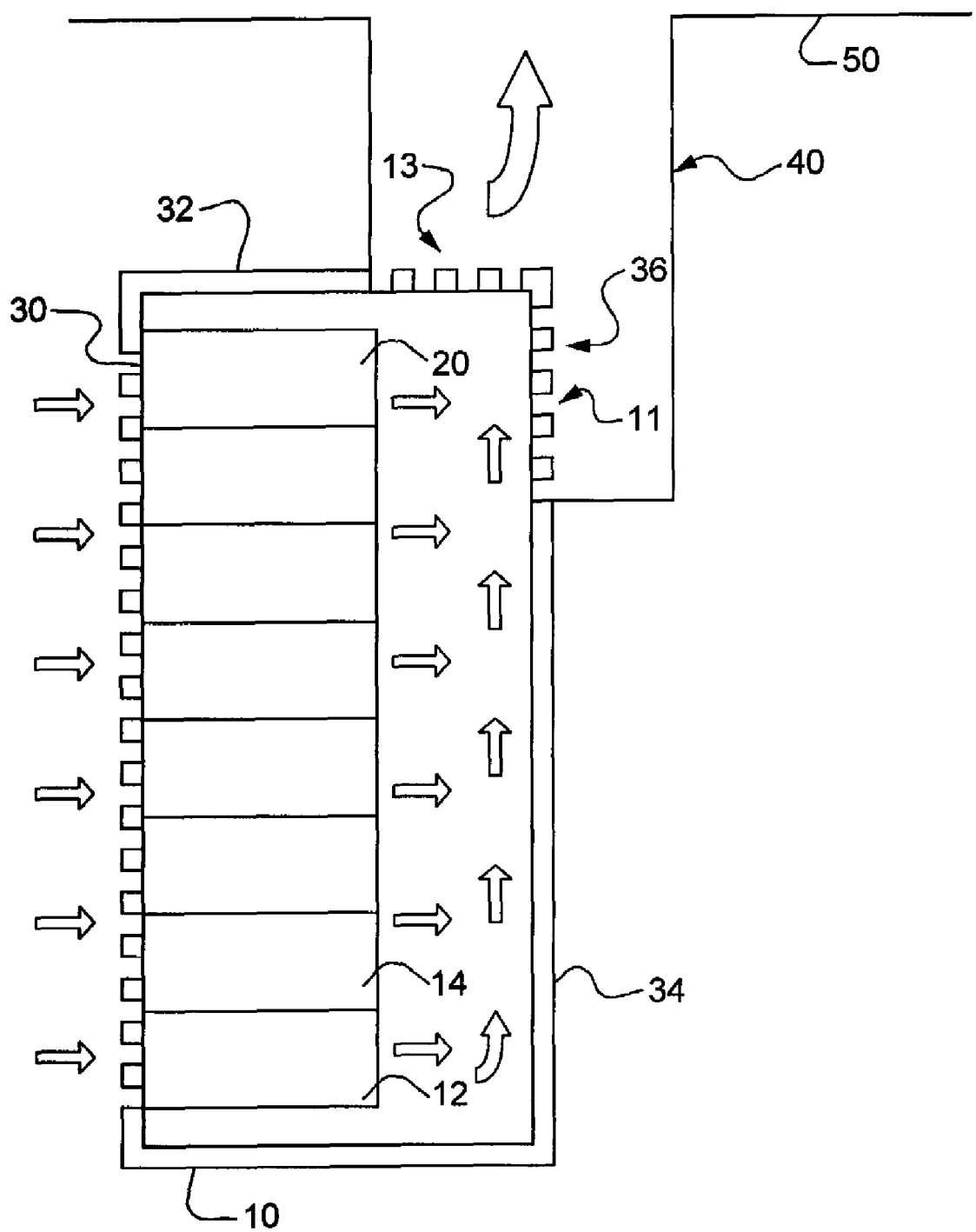
FIG. 1A is a schematic conceptual diagram of the assembly for extracting heat from a housing for electronic equipment of this invention.
Figure 1B:
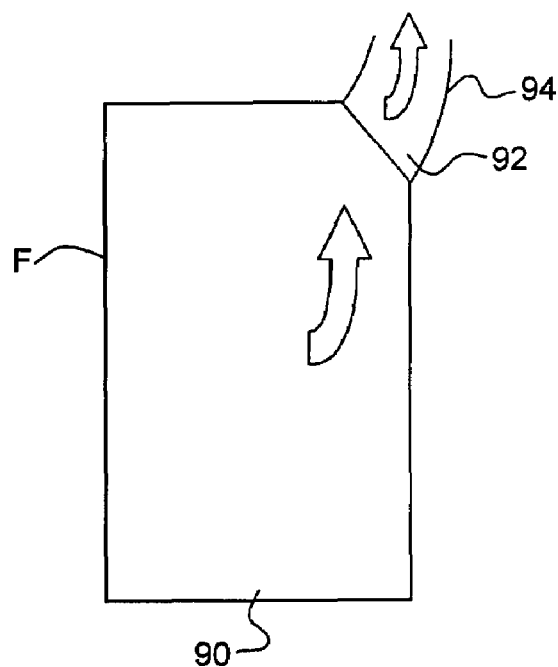
FIGS. 1B and 1C are similar drawings of two alternative embodiments of the invention.
Figure 1C:
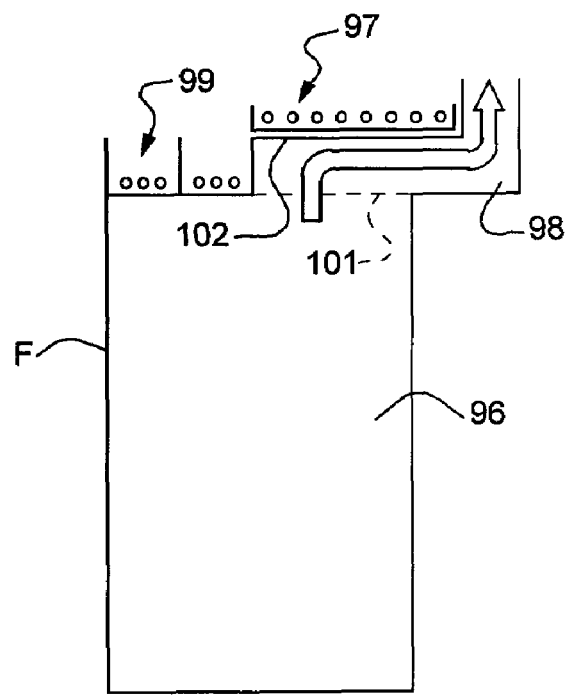

FIGS. 1A-1C schematically depict three concepts for accomplishing the invention, which is an assembly for extracting heat from a housing for electronic equipment. In this case, housing 10 may be a computer server rack such as a "Paramount" enclosure offered by Wright Line LLC of Worcester, Mass. Computer equipment rack 10 holds a number of modules or the like each comprising computer equipment: a series of vertically-arranged computer server modules 12, 14 ... 20 are shown. Rack 10 is a rectangular prism with front 30, top 32, and back 34. The two solid sides are not shown in the drawing. In accordance with the invention, back 34 is essentially solid except for open area 36 comprising opening or perforated area 11 in back 34 proximate top 32 and opening or perforated area 13 in top 32 proximate back 34. The open area 36 comprises some of the back, and may include an adjacent portion of the top as shown in this drawing. Air passageway 40 is in fluid communication with open area 36, to conduct heated air exiting housing 10 through open area 36 away from housing 10 and into enclosed air return ceiling area 50. Cool air enters housing 10 through perforated front door 30.

FIGS. 1B and 1C are two additional conceptual embodiments of the invention. Embodiment 90, FIG. 1B, has open area 92 at the top/back corner, with air passageway 94 communicating therewith. Air enters through front F. Embodiment 96, FIG. 1C, has open area 101 in the top, with air passageway 98 communicating therewith. Air enters through front F. In this case, even though the heated air outlet is in the top (and could also be in some of the adjacent back, a feature not shown in this drawing), the top is still available to carry cables and/or other equipment by including raised top portion 102, which forms part of passageway 98. Top portion 102 can actually be the top of a rigid version of passageway 98, which may be accomplished with a duct. Cable trays 97 and 99 route cables or other equipment along the top.

Figure 2:
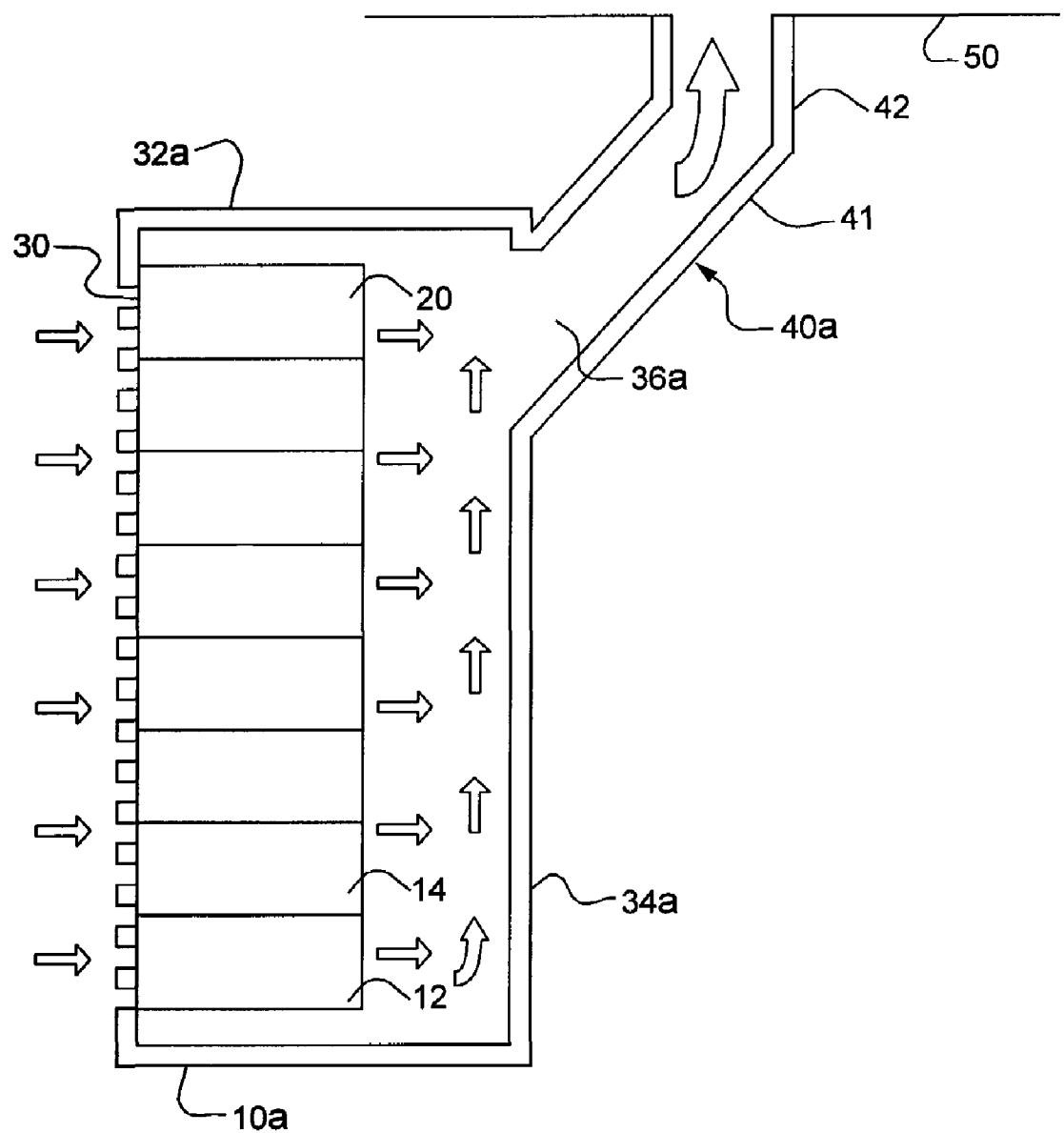
FIG. 2 is a schematic, cross-sectional view of another embodiment of the invention accomplished in a computer equipment rack with an assembly for extracting heat from the rack in accordance with the present invention.

One preferred embodiment of an assembly for extracting heat from a housing for electronic equipment is shown in FIG. 2. Computer equipment rack 10a holds a number of modules or the like each comprising computer equipment: a series of vertically-arranged modules 12, 14 ... 20 are shown. Rack 10a is typically a rectangular prism shape, and has a perforated front 30, top 32a, and back 34a; the solid side panels are not shown. In accordance with the invention, back 34a is essentially solid except for open area 36a proximate top 32a. Air passageway 40a is in fluid communication with open area 36a, to conduct heated air exiting housing 10a through open area 36a away from housing 10a. Air passageway 40a in this example comprises first section 41 that is angled at about 45 degrees up and away from the plane of back 34a, and more vertical section 42 that leads to enclosed air return ceiling area 50. Cool air enters housing 10a through perforated front door 30.

The invention contemplates any reasonable arrangement of an air passageway that is in fluid communication with an open area at the top of the back and/or the back of the top. The open area preferably extends across at least a majority of the width of the back of the housing, and may also encompass a portion of the top of the housing adjacent to the back, as shown in FIGS. 1A and 1B. In the preferred embodiment, a significant portion of the top is essentially solid so that the majority (or all) of the top area of the housing is available for routing cables and holding other peripheral equipment that is necessary in a data center, as shown in FIG. 1C. This contrasts the invention with racks that have one or more openings in the top that directly vent heated air into the room or a vertical duct but that take away area from the top of the racks that could otherwise be used for routing other data center equipment, such as power and data cables and the like.

The open area can be any shape or arrangement. The assembly of this invention can be installed in a new equipment rack or offered as an after-market product with a back having a particular size, shape and location of an open area, and an air passageway that may be accomplished with one or more flexible or inflexible ducts or conduits, depending upon the particular arrangement.

Figure 3:
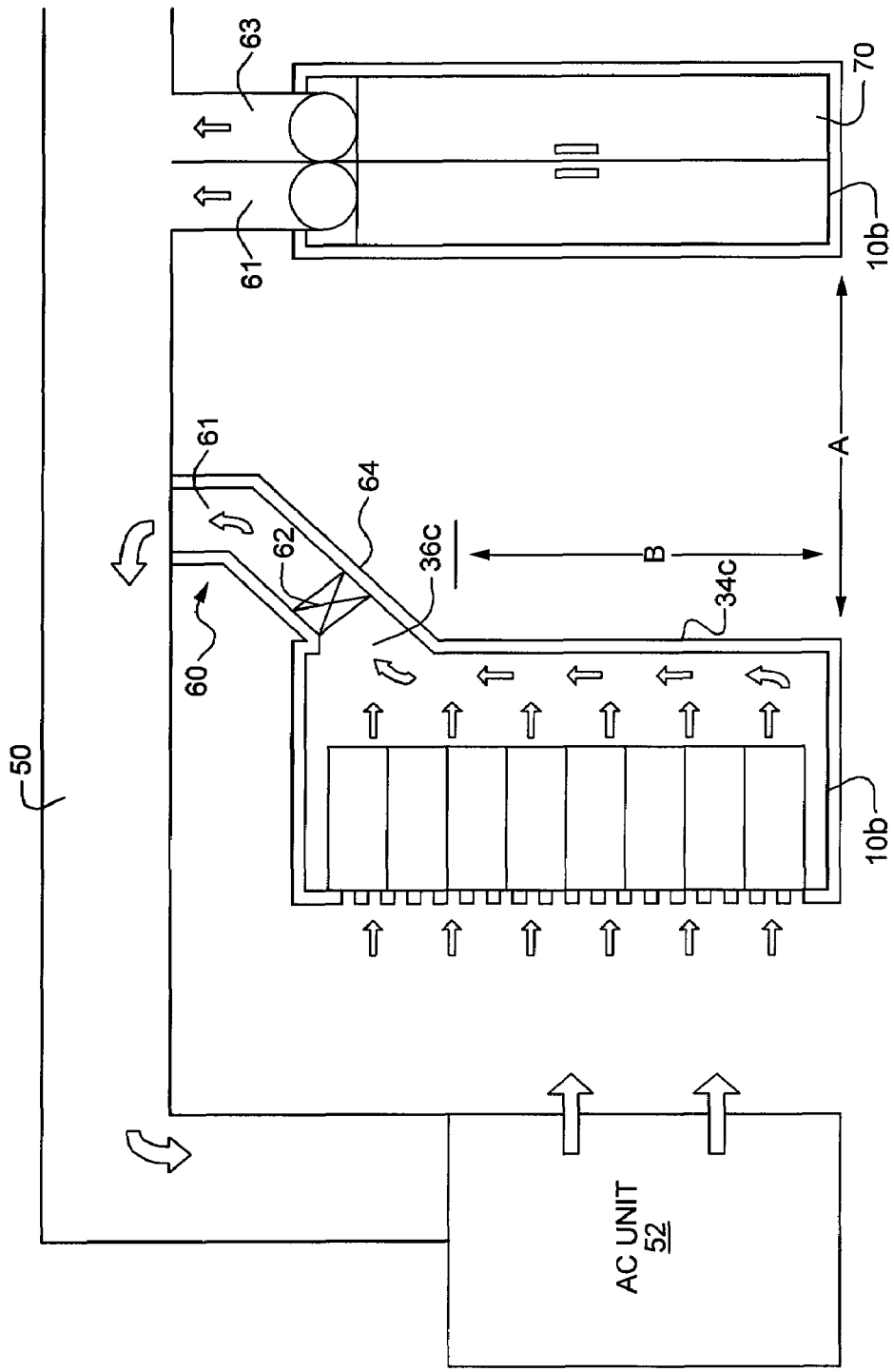
FIG. 3 is a similar view showing two adjacent racks in a data center arrangement according to this invention.

Once such particular arrangement is shown in FIG. 3, which illustrates two adjacent identical racks 10b, one in cross section and one in a rear view. Air passageway 60 comprises two side-by-side essentially identical circular flexible ducts 61 and 63 that are coupled to the upper back area of each of equipment rack 10a (viewed from the side) and rack 10b (viewed from the back, in which split rear door 70, located below ducts 61 and 63, is visible). This drawing also illustrates one option in which an air-moving device 62 is placed in air passageway 60, or in fluid communication therewith, to assist the movement of air.

Overall airflow is depicted in the drawings by the solid arrows. Preferably, the solid front door of the rack is replaced with a perforated front that has a series of openings, somewhat like a screen door. This allows cooled room air to enter the front of the rack and pass through equipment modules 12, 14 ... 20. Heated air flows out through the back of these modules, typically assisted by fans located in the modules themselves. The heated air is naturally buoyant and rises along back 34c and out through open area 36c. The inventive assembly thus acts somewhat like a chimney in that it is a passageway to allow heated air to escape from the inside of a housing for electronic equipment.

FIG. 3 also illustrates an embodiment of a data center arrangement according to this invention comprising two or more electronic equipment racks 10 a and 10b. In this embodiment, racks 10a and 10b are essentially equivalent to rack 10, FIG. 1, except for the particular arrangement of the open area in backs 34c near the tops of the racks. Air passageways 60 connect these openings to enclosed ceiling area 50 which leads to air conditioning unit 52 that cools the air and blows it back into the data center so that it can enter the perforated front of racks 10a and 10b. Air-moving devices 62 may not be necessary if there is sufficient pressure drop in ceiling area 50 to draw the heated air up into area 50; this is a detail that depends on the particular arrangement of the data center.

The invention accomplishes efficient cooling of electronic equipment in the housing without the need for deep rear doors having internal fans and ducting that withdraws heated air out of the housing and blows it out of the top of the door, of the type known in the art. The invention thus accomplishes efficient cooling without increasing the depth of the equipment rack up to the height B off of the floor at which the air passageway projects from the housing. This allows racks to be separated by a minimum width A. Dimensions A and B may be dictated by local, state and/or federal regulations, such as the Americans with Disability Act (ADA) and/or the National Fire Protection Association (NFPA) codes. In one example, regulations require an 80" unobstructed headroom height (which can establish the minimum height "B"), and a minimum aisle width of 36" (which can establish the minimum inter-rack spacing "A"). Regardless of the minimum dimensional needs, the invention accomplishes a maximum density of equipment housings in a data center area, as it does away with the need for thickened front and/or rear doors that have been necessary to accommodate air-handling equipment.

It should be understood that the embodiments described herein are exemplary and do not limit the scope of the invention, and that various modifications could be made by those skilled in the art that would fall under the scope of the invention. The scope of the invention is set forth in the claims.

What is claimed is:

1. An assembly comprising:
 a housing with an interior that is adapted to hold heat-generating electronic equipment, the housing comprising a generally rectangular vertical front portion, two generally rectangular vertical side portions coupled to the front portion, an essentially solid, generally rectangular top portion coupled to the side portions and to the front portion, and an essentially solid, generally rectangular back portion coupled to the side portions;
 where the top portion defines a first opening leading to the housing interior, the first opening located at the back of the top portion, proximate the back portion;
 where the back portion defines a second opening leading to the housing interior, the second opening located at the top of the back portion, proximate the top portion;
 where the first opening is contiguous with the second opening; and
 a chimney external to the housing and comprising a bottom wall coupled to the back portion of the housing proximate the second opening, a front wall coupled to the top portion of the housing proximate the first opening, a back wall opposite the front wall, and two opposing side walls;
 where the chimney defines an air passageway that encompasses and is in fluid communication with the first and second openings, the air passageway comprising an inlet for taking in air leaving the housing through the first and second openings and an outlet for conducting the air out of the air passageway.

2. The assembly of claim 1 in which the second opening extends across at least a majority of the width of the back portion of the housing.

3. The assembly of claim 2 in which the second opening extends across substantially all of the width of the back portion of the housing.

4. The assembly of claim 1 further comprising an air-moving device in fluid communication with the air passageway.

5. The assembly of claim 4 in which the air-moving device is located in the air passageway.

6. The assembly of claim 4 in which the air-moving device is located at the intersection of the back portion of the housing and the air passageway.

7. The assembly of claim 1 in which the front portion of the housing is perforated.

8. The assembly of claim 7 in which the side portions of the housing are essentially solid.

9. The assembly of claim 8 in which at least a substantial portion of the top of the housing is available for routing of additional equipment.

10. The assembly of claim 1 in which the back portion of the housing comprises one or more doors, to provide access to the housing through the back.

11. The assembly of claim 1 further comprising an air-moving device in the chimney.

12. The assembly of claim 1 in which the chimney is located at least about eighty inches above the floor.

13. The assembly of claim 1 in which the chimney extends out from the back portion of the housing.

14. The assembly of claim 13 in which the chimney extends up after extending out from the back portion of the housing.

15. The assembly of claim 1 in which the chimney extends out at an angle of no more than about ninety degrees from the back portion of the housing.

16. A data center arrangement comprising:
 at least two electronic equipment racks spaced apart by at least about thirty-six inches, each rack comprising a generally rectangular vertical front portion, two generally rectangular vertical side portions coupled to the front portion, an essentially solid, generally rectangular top portion coupled to the side portions and to the front portion, and an essentially solid, generally rectangular back portion coupled to the side portions;
 where the top portion of each rack defines a first opening leading to the rack interior, the first opening located at the back of the top portion, proximate the back portion;
 where the back portion of each rack defines a second opening leading to the rack interior, the second opening located at the top of the back portion, proximate the top portion;
 where the first opening is contiguous with the second opening; and
 a chimney for each rack, each chimney external to the rack and comprising a bottom wall coupled to the back portion of the rack proximate the second opening, a front wall coupled to the top portion of the rack proximate the first opening, a back wall opposite the front wall, and two opposing side walls, where each chimney defines an air passageway that encompasses and is in fluid communication with the first and second openings, the air passageway comprising an inlet for taking in air leaving the rack through the first and second openings and an outlet for conducting the air out of the air passageway.

17. The data center arrangement of claim 16 further comprising an enclosed ceiling.

18. The data center arrangement of claim 17 in which the air passageways are in fluid communication with the enclosed ceiling.

19. The data center arrangement of claim 18 further comprising an air-cooling apparatus in fluid communication with the enclosed ceiling.

20. The data center arrangement of claim 19 further comprising means for providing cooled air from the air-cooling apparatus to the front of the racks.

21. An assembly comprising:
 a housing with an interior that is adapted to hold heat-generating electronic equipment, the housing comprising a generally rectangular vertical front portion, two generally rectangular vertical side portions coupled to the front portion, an essentially solid, generally rectangular top portion coupled to the side portions and to the front portion, and an essentially solid, generally rectangular back portion coupled to the side portions;
 where the top portion defines a first opening leading to the housing interior, the first opening located at the back of the top portion, proximate the back portion;
 where the back portion defines a second opening leading to the housing interior, the second opening located at the top of the back portion, proximate the top portion;
 where the second opening extends across substantially all of the width of the back portion of the housing;
 where the first opening is contiguous with the second opening; and
 a chimney external to the housing and comprising a bottom wall coupled to the back portion of the housing proximate the second opening, a front wall coupled to the top portion of the housing proximate the first opening, a back wall opposite the front wall, and two opposing side walls;

where the chimney defines an air passageway that encompasses and is in fluid communication with the first and second openings, the air passageway comprising an inlet for taking in air leaving the housing through the first and second openings and an outlet for conducting the air out of the air passageway; and where the chimney extends out from the back portion of the housing at an angle, and extends up after extending out from the back portion of the housing.

* * * * *